United States Patent
Shchegrov et al.

(10) Patent No.: US 10,151,986 B2
(45) Date of Patent: Dec. 11, 2018

(54) SIGNAL RESPONSE METROLOGY BASED ON MEASUREMENTS OF PROXY STRUCTURES

(71) Applicant: KLA-Tencor Corporation, Milpitas, CA (US)

(72) Inventors: Andrei V. Shchegrov, Campbell, CA (US); Thaddeus Gerard Dziura, San Jose, CA (US); Stilian Ivanov Pandev, Santa Clara, CA (US); Leonid Poslavsky, Belmont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 74 days.

(21) Appl. No.: 14/790,793

(22) Filed: Jul. 2, 2015

(65) Prior Publication Data
US 2016/0003609 A1    Jan. 7, 2016

Related U.S. Application Data

(60) Provisional application No. 62/021,659, filed on Jul. 7, 2014.

(51) Int. Cl.
*G03F 7/20* (2006.01)
*H01L 21/66* (2006.01)

(52) U.S. Cl.
CPC ............ *G03F 7/7065* (2013.01); *G03F 7/705* (2013.01); *H01L 22/12* (2013.01)

(58) Field of Classification Search
CPC ................................ G03F 7/20; G03F 7/7065
(Continued)

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

WO    2007123696 A2    11/2007

OTHER PUBLICATIONS

International Search Report dated Sep. 30, 2015, for PCT Application No. PCT/US2015/039202 filed on Jul. 6, 2015 by KLA-Tencor Corporation, 3 pages.

*Primary Examiner* — Tarifur Chowdhury
*Assistant Examiner* — Omar Nixon
(74) *Attorney, Agent, or Firm* — Spano Law Group; Joseph S. Spano

(57) ABSTRACT

Methods and systems for estimating values of parameters of interest of actual device structures based on optical measurements of nearby metrology targets are presented herein. High throughput, inline metrology techniques are employed to measure metrology targets located near actual device structures. Measurement data collected from the metrology targets is provided to a trained signal response metrology (SRM) model. The trained SRM model estimates the value of one or more parameters of interest of the actual device structure based on the measurements of the metrology target. The SRM model is trained to establish a functional relationship between actual device parameters measured by a reference metrology system and corresponding optical measurements of at least one nearby metrology target. In a further aspect, the trained SRM is employed to determine corrections of process parameters to bring measured device parameter values within specification.

22 Claims, 8 Drawing Sheets

(58) Field of Classification Search
USPC .......................................................... 356/625
See application file for complete search history.

(56) References Cited

U.S. PATENT DOCUMENTS

| | | |
|---|---|---|
| 6,429,943 B1 | 8/2002 | Opsal et al. |
| 6,633,831 B2 | 10/2003 | Nikoonahad et al. |
| 6,734,967 B1 | 5/2004 | Piwonka-Corle et al. |
| 6,816,570 B2 | 10/2004 | Janik et al. |
| 6,895,075 B2 | 5/2005 | Yokhin et al. |
| 6,972,852 B2 | 12/2005 | Opsal et al. |
| 7,478,019 B2 | 1/2009 | Zangooie et al. |
| 7,826,071 B2 | 11/2010 | Shchegrov et al. |
| 7,929,667 B1 | 4/2011 | Zhuang et al. |
| 7,933,026 B2 | 4/2011 | Opsal et al. |
| 9,383,661 B2 | 7/2016 | Pandev et al. |
| 9,784,690 B2 | 10/2017 | Sapiens et al. |
| 2002/0033945 A1* | 3/2002 | Xu ..................... G01B 11/0641 356/369 |
| 2002/0090744 A1 | 7/2002 | Brill et al. |
| 2004/0070772 A1* | 4/2004 | Shchegrov ........... G01N 21/211 356/625 |
| 2004/0233443 A1* | 11/2004 | Mieher ................ G01N 21/956 356/401 |
| 2006/0009872 A1 | 1/2006 | Prager et al. |
| 2008/0033683 A1 | 2/2008 | Li et al. |
| 2009/0279090 A1* | 11/2009 | Wolf ..................... G01B 11/24 356/369 |
| 2010/0245812 A1 | 9/2010 | Saito et al. |
| 2012/0210289 A1* | 8/2012 | Hench ................ G03F 7/70491 716/122 |
| 2012/0226644 A1* | 9/2012 | Jin .......................... G06N 3/08 706/19 |
| 2013/0077742 A1 | 3/2013 | Schueler et al. |
| 2013/0144560 A1* | 6/2013 | Pisarenco ............. G01N 21/47 702/189 |
| 2013/0304424 A1 | 11/2013 | Bakeman et al. |
| 2014/0019097 A1 | 1/2014 | Bakeman et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0046118 A1 | 2/2015 | Pandev et al. |
| 2015/0235108 A1 | 8/2015 | Pandev et al. |

* cited by examiner

SIGNAL RESPONSE METROLOGY BASED ON MEASUREMENTS OF PROXY STRUCTURES

CROSS REFERENCE TO RELATED APPLICATION

The present application for patent claims priority under 35 U.S.C. § 119 from U.S. provisional patent application Ser. No. 62/021,659, entitled "Metrology and Method to Control Process Parameters to Improve Semiconductor Device Yield and Edge Placement Errors," filed Jul. 7, 2014, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Most advanced logic and memory devices fabricated at semiconductor device fabrication nodes below 20 nanometers are constructed using multiple patterning processes. Exemplary multiple patterning processes include self-aligned double patterning (SADP), self-aligned triple patterning (SATP), and self-aligned quadruple patterning (SAQP) techniques.

In one example, a SAQP fin formation process achieves a target pitch that is one-quarter of the pitch obtainable with conventional single pattern lithography. In one example, at least fourteen steps are required to generate the fin structures. These steps include lithography, etch, and strip steps that must be precisely controlled to realize the fin structures with the desired pitch and profile. The final pitch values and fin profile (e.g. CD, SWA) achieved by the SAQP fin formation process are impacted by structural parameter values from previous steps (e.g., resist profile parameters, spacer film thicknesses, and others).

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

In some examples, optical critical dimension (CD) and film metrologies (spectroscopic or angle-resolved) are employed to monitor structural parameter values during multiple patterning processes to ensure that structures are fabricated having the desired pitch and profile. However, optical CD and film metrologies suffer from lack of sensitivity to many structures employed in multiple patterning techniques, buried structures, in particular. For some structural parameters, such as edge placement error (EPE), there is currently no high throughput (e.g., optical) measurement solution.

In another example, optical overlay metrology is also employed, but optical overlay measurements require specialized metrology targets to characterize structures fabricated by multiple patterning techniques. In existing methods, overlay error is typically evaluated based on measurements of specialized target structures formed at various locations on the wafer by a lithography tool. The target structures may take many forms, such as a box in box structure. In this form, a box is created on one layer of the wafer and a second, smaller box is created on another layer. The localized overlay error is measured by comparing the alignment between the centers of the two boxes. Such measurements are taken at locations on the wafer where target structures are available.

Unfortunately, these specialized target structures often do not conform to the design rules of the particular semiconductor manufacturing process being employed to generate the electronic device. This leads to errors in estimation of overlay errors associated with actual device structures that are manufactured in accordance with the applicable design rules. For example, image-based overlay metrology often requires the pattern to be resolved with an optical microscope that requires thick lines with critical dimensions far exceeding design rule critical dimensions. In another example, angle-resolved SCOL often requires large pitch targets to generate sufficient signal at the +1 and −1 propagating diffraction orders from the overlay targets. In some examples, pitch values in the range 500-800 nm may be used. Meanwhile, actual device pitches for logic or memory applications (design rule dimensions) may be much smaller, e.g., in the range 100-400 nm, or even below 100 nm.

FIG. 1 depicts a hardmask pattern of line structures 11 fabricated in a static random access memory (SRAM) area 10 of a microelectronic chip. The complex layout of the active region is created by combining multiple patterning techniques with cut masks. Cut masks selectively remove portions of the hardmask layer that is used to pattern the substrate into active regions. FIG. 2 depicts a bottom anti-reflective coating (BARC) layer 12 and a resist layer 13 disposed on top of the pattern of line structures depicted in FIG. 1. The resist layer is used to selectively remove part of the hardmask pattern below the openings 14 of the resist layer 13. As depicted in FIG. 1, the hardmask pattern of line structures 11 is buried by the BARC layer 12, even within the openings 14 of the resist layer 13.

To provide adequate yield for the cut mask process, reliable measurements for profile (e.g., CD, HT, SWA) film thicknesses, and overlay are required. A calculation of overlay reveals that it is a function of many structural parameters from previous steps of a quadruple patterning process. The distribution of the gap between the edge of the cut and the adjacent line structure, and hence the yield of the process, depends on a complex interaction of all the process parameters.

In another example, edge placement distance (EPD) and the associated edge placement error (EPE) is an important parameter to monitor and control after device electrical contacts are made. The difference between the desired and the actual EPD is called EPE. EPD and EPE are a function of both overlay and CD errors.

In some examples, critical dimension-scanning electron microscopy (CD-SEM) may be employed to measure overlay and EPE. However, most advanced process nodes require small metrology errors and high throughput that are not achievable with CD-SEM tools.

In summary, semiconductor device yield at device fabrication nodes below 20 nanometers for logic devices and advanced DRAM, and vertical or planar NAND devices is a complex function of many parameters, including film thicknesses, profile parameters of patterned lines, overlay errors, and edge placement errors (EPE). Of these, EPE has the most demanding process window and requires metrology and control of CD and overlay. Currently there is no high-throughput, optical metrology solution for EPE measurements and many on-device overlay measurement applications. In addition, the absence of adequate metrology makes it challenging to define control schemes to improve device yield.

SUMMARY

Methods and systems for estimating values of parameters of interest of actual device structures based on optical measurements of nearby metrology targets are presented herein. High throughput, inline metrology techniques (e.g., optical scatterometry, imaging overlay, or other techniques) are employed to measure metrology targets located near actual device structures. Measurement data collected from the metrology targets is provided to a trained signal response metrology (SRM) model. The trained SRM model estimates the value of one or more parameters of interest of the actual device structure based on the measurements of the metrology target. Examples of parameters of interest include, but are not limited to, edge placement error (EPE), overlay, pitch walk, and critical dimension (CD) of an actual device structure located in the device area of a wafer.

In one novel aspect, the signal response metrology (SRM) model is trained to establish a functional relationship between measured values of parameters of interest of actual device structures and corresponding measurement data associated with measurements of at least one nearby metrology target. In this manner, the device being characterized by the measurement (i.e., the actual device structure) is different from the metrology target undergoing measurement by the high-throughput metrology technique.

The metrology target is selected to produce optical measurement signals with high sensitivity to actual device parameters of interest. The training or mapping is performed to actual device structures measured with reference tools such as CD-SEM, CD/OVL-SAXS, AFM, or model-based optical CD. After the mapping is performed, production wafers can be measured inline. Measurement data collected from metrology targets is mapped to parameters of interest of actual device structures by the trained SRM model.

In some examples, the metrology target is separated from the actual device structure to be measured by time (i.e., separated by one or more process steps). The metrology target measurements and any associated reference measurements are performed at two distinct steps in the processing flow. The differences in the measured signals at each distinct processing step are treated as training signals for training purposes and measurement signals for measurement purposes. In these examples, the training sequence can use the same or different types of targets that are separated by one or more processing steps from the actual device structure to be measured. In some examples, the metrology targets are actual device structures in a particular process state. Optical measurement data collected from actual device structures in a particular process state are used to train a measurement model as described herein. The trained measurement model is then used to calculate values of structural parameters, process parameters, or both, of actual device structures in a subsequent process state based on optical measurement data collected from the same or different device structures at the same particular process state used to train the measurement model.

The training of the SRM model is performed under a controlled DOE (design of experiments) variation of process parameters (e.g., lithography focus, exposure, aberration parameters, overlay offset, etch time, temperature, pressure, and other local or global parameters). After training is complete, inline optical metrology can operate in a stand-alone or integrated mode.

In a further aspect, the trained SRM is employed to determine corrections of process parameters to bring measured device parameter values within specification. The corrections can be performed in real time or on a one-time basis.

The measurement model is trained for all measured signals in the process variation space defined by the DOE set. Thus, a mapping may be determined between the process variables within the DOE process variation space and the actual device parameters of interest measured with the reference tool(s). A correction to one or more process parameters is determined based on a measured value of an actual device parameter and the mapping between the actual device parameter and the one or more process parameters.

The trained measurement models described herein receive optical measurement data directly as input and provide values of parameters of interest as output. By streamlining the measurement process, the predictive results are improved along with a reduction in computation and user time.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
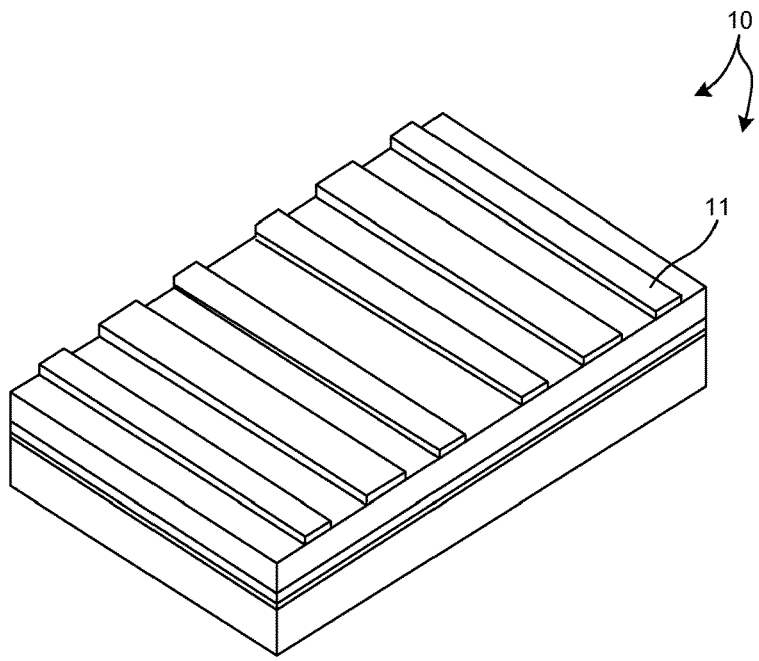
FIG. 1 is a diagram depicting a hardmask pattern of line structures 11 fabricated in a static random access memory (SRAM) area 10 of a microelectronic chip.
Figure 2:
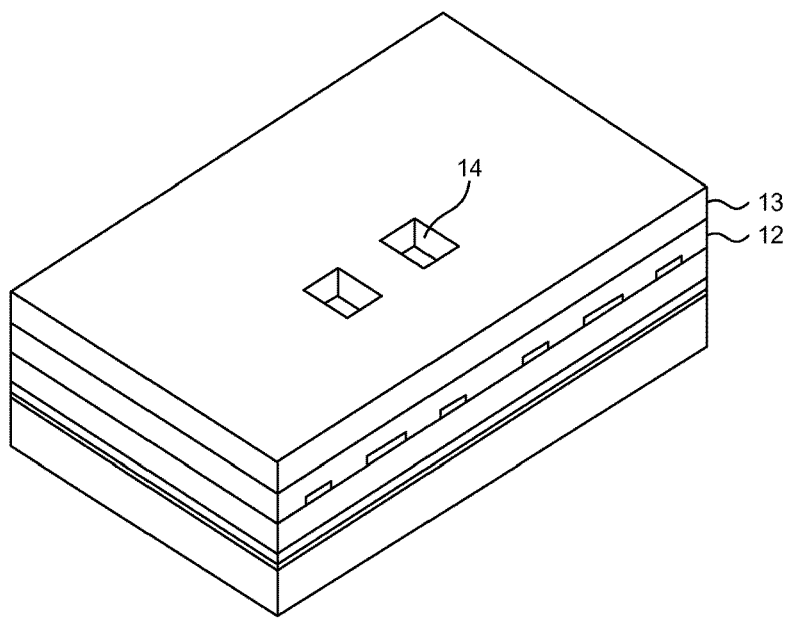
FIG. 2 is a diagram depicting a bottom anti-reflective coating (BARC) layer 12 and a resist layer 13 disposed on top of the pattern of line structures depicted in FIG. 1.

Reference will now be made in detail to background examples and some embodiments of the invention, examples of which are illustrated in the accompanying drawings.

Methods and systems for estimating values of parameters of interest of actual device structures based on optical measurements of nearby metrology targets are presented herein. High throughput, inline metrology techniques (e.g., optical scatterometry, imaging overlay, or other techniques) are employed to measure metrology targets located near actual device structures. The high throughput, inline metrology techniques typically lack measurement sensitivity to the parameters of interest for the actual device structures, but have sufficient sensitivity to parameters of nearby metrology targets. The optical metrology targets are located sufficiently close to the actual device structures of interest to ensure that spatial process variations do not significantly affect the robustness of the measurement algorithm. Measurement data collected from the metrology targets is provided to a trained signal response metrology (SRM) model. The trained SRM model estimates the value of one or more parameters of interest of the actual device structure based on the measurements of the metrology target. Examples of parameters of interest include, but are not limited to, edge placement error (EPE), overlay, pitch walk, and critical dimension (CD) of an actual device structure located in the device area of a wafer.

In one novel aspect, the SRM (signal response metrology) model is trained to establish a functional relationship between measured values of parameters of interest of actual device structures and corresponding measurement data associated with measurements of at least one nearby metrology target for a set of measurement sites. In this manner, the device being characterized by the measurement (i.e., the actual device structure) is different from the metrology target undergoing measurement by the high-throughput metrology technique.

In some examples, the metrology target to be measured is spatially separated from the actual device structure to be characterized. The metrology target is selected to produce optical measurement signals with high sensitivity to parameters of interest such as overlay or EPE. However, the training or mapping is performed to actual device structures measured with reference tools such as CD-SEM, CD/OVL-SAXS, AFM, or model-based optical CD. After the mapping is performed, production wafers can be measured inline and measurement data collected from metrology targets is mapped to parameters of interest of actual device structures by the trained SRM model.

In some other examples, the metrology target is separated from the actual device structure to be measured by time (i.e., separated by one or more process steps). In these examples, the training sequence can use the same or different types of targets that are separated by one or more processing steps from the actual device structure to be measured. In some examples, the metrology targets are actual device structures in a particular process state. Optical measurement data collected from actual device structures in a particular process state are used to train a measurement model as described herein. The trained measurement model is then used to calculate values of structural parameters, process parameters, or both, of actual device structures in a subsequent process state based on optical measurement data collected from the same or different device structures at the same particular process state used to train the measurement model.

High-throughput, optical metrology techniques often lack sensitivity to actual device parameters such as EPE, overlay, CD, pitch walk, etc. For purposes of training, measurements of the actual device structures are performed by a reference metrology system that is capable of measuring the actual device structure directly. For example, a Critical Dimension Scanning Electron Microscope (CD-SEM), a Critical Dimension Small Angle X-Ray Scatterometer (CD-SAXS), an Atomic Force Microscope (AFM), etc. may be employed to perform reference measurements of an actual device structure. These measurement techniques are unable to be used for inline metrology due to low throughput, high measurement uncertainty for each individual site, etc. However, a trained SRM model that relates measurement data collected from a nearby metrology target by a high-throughput metrology technique to parameters of interest of an actual device structure can be employed to provide inline metrology of parameters of interest such as EPE, OVL, pitch walk, CD.

The training of the SRM model is performed under a controlled DOE (design of experiments) variation of process parameters (e.g., lithography focus, exposure, aberration parameters, overlay offset, etch time, temperature, pressure, and other local or global parameters). After training is complete, inline optical metrology can operate in a stand-alone or integrated mode.

In a further aspect, the trained SRM is employed to determine corrections of process parameters to bring measured device parameter values within specification. The corrections can be performed in real time or on a one-time basis.

In another further aspect, the SRM model is employed to measure process parameters of interest (e.g., focus/dose, exposure, etc.), in addition to one or more structural parameters of interest (e.g., EPE, overlay, CD, pitch walk, etc.) from the same metrology targets. In these examples, the measured, optical-based training data also includes known values of the process parameters of interest. In this manner, the trained measurement model is sensitive to these parameters of interest. Such a trained measurement model is employed to characterize both structural and process parameters of interest.

In another further aspect, the metrology targets located on one or more measurement sites of a DOE wafer are preferably design rule targets. In other words, the metrology targets adhere to the design rules applicable to the underlying semiconductor manufacturing process. In some examples, the metrology targets are preferably located within the active die area. In some examples, the metrology targets have dimensions of 15 micrometers by 15 micrometers, or smaller. In this manner, the impact on overlay of intra-field variations induced by lithographic imperfections can be analyzed. In some other examples, the metrology targets are located in the scribe lines, or otherwise outside the active die area.

By using raw optical measurement data to create the measurement model, as described herein, the errors and approximations associated with traditional model based metrology methods are reduced. In addition, the measurement model is not sensitive to systematic errors, asymmetries, etc. because the measurement model is trained based on optical measurement data collected from a particular metrology system and used to perform measurements based on optical measurement data collected from the same metrology system.

The trained measurement models described herein receive optical measurement data directly as input and provide values of parameters of interest as output. By streamlining the measurement process, the predictive results are improved along with a reduction in computation and user time. In some examples, the measurement model can be created in less than an hour. In addition, by employing a simplified model, measurement time is reduced compared to existing metrology methods.

Figure 3:
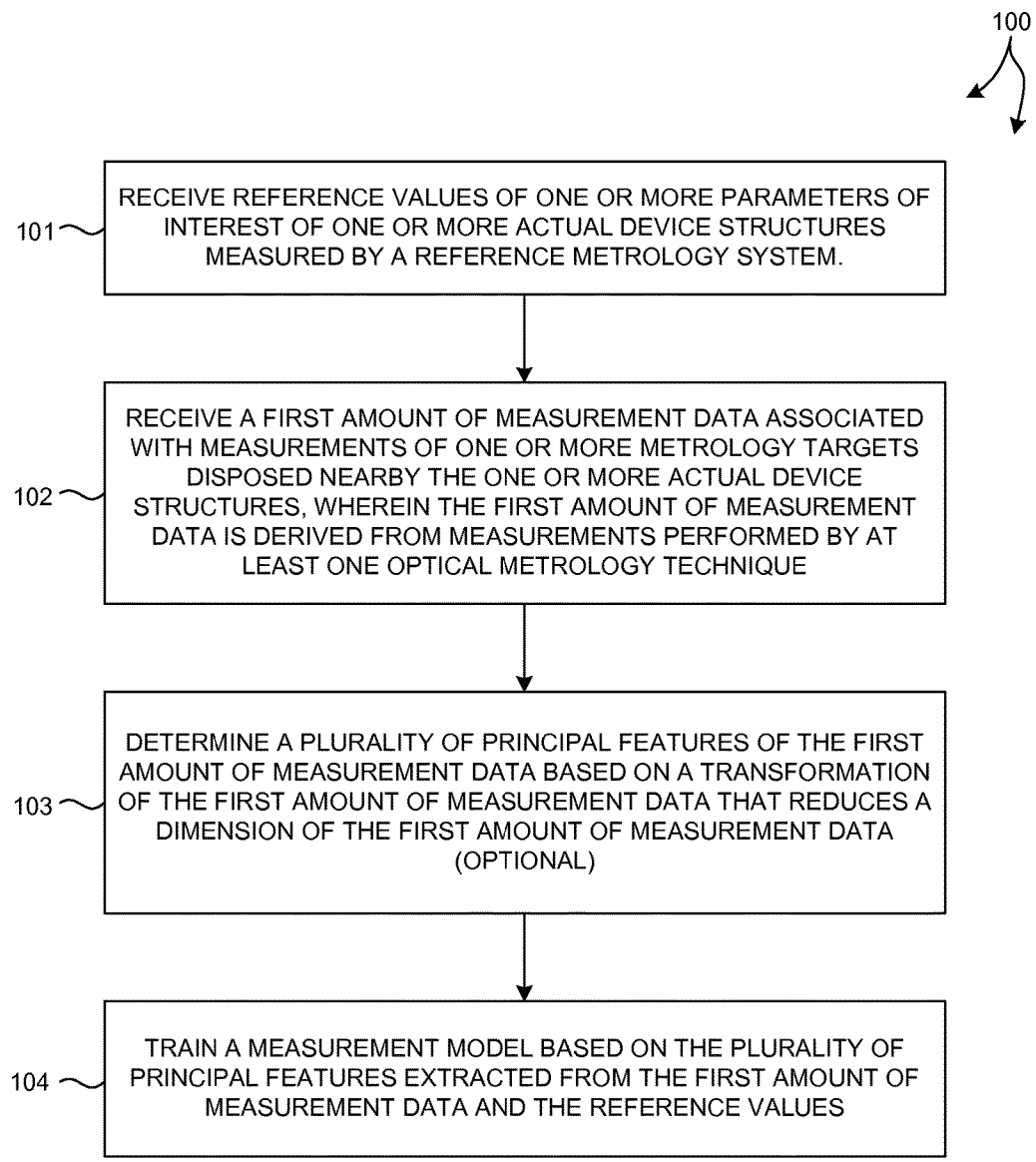
FIG. 3 illustrates a method 100 of training a SRM measurement model suitable for measuring actual device structures based on measurements of a nearby metrology target in at least one novel aspect.

FIG. 3 illustrates a method 100 of training a SRM measurement model in at least one novel aspect. Method 100 is suitable for implementation by a metrology system such as metrology system 300 illustrated in FIG. 5 of the present invention. In one aspect, it is recognized that data processing blocks of method 100 may be carried out via a pre-programmed algorithm executed by one or more processors of computing system 330, or any other general purpose computing system. It is recognized herein that the particular structural aspects of metrology system 300 do not represent limitations and should be interpreted as illustrative only. The training is performed at selected time intervals or when process change or excursion occurs. Training of the measurement model with data collected from a reference metrology tool is not performed on every production wafer.

In block 101, reference measurement values of one or more parameters of interest of one or more actual device structures measured by a reference metrology system are received by a computing system (e.g., computing system 330). By way of non-limiting example, parameters of interest of actual device structures include CD, overlay, EPE, etc.

The measurement sites probed by the reference metrology system include actual device structures having one or more parameters of interest that are measured by the reference metrology system. In general, the reference measurements may be performed by one or more reference metrology systems. By way of non-limiting example, SEM, AFM, SAXS, and electrical measurement systems may be used alone, or in combination to generate the reference measurement values. The measurement by a reference metrology system may be performed either on device structures or on device-like structures located, e.g. in the scribeline area, to make them more suitable for reference metrology measurement.

In block 102, measurement data associated with measurements of one or more metrology targets disposed nearby the one or more actual device structures is received by the computing system (e.g., computing system 330). The measurements of the metrology target(s) are performed by an optically based metrology system (e.g., optical scatterometer, optical overlay imaging system, etc.). In general, the metrology targets probed by the optical metrology system exhibit sensitivity to one or more process parameters being varied as part of a DOE set of metrology targets and associated actual device structures.

Variations of one or more process parameters, structural parameters, or both, are organized in a DOE pattern on the surface of one or more semiconductor wafers for training purposes. In this manner, the reference and optical measurement systems interrogate different locations on the wafer surface that correspond to different values of one or more process parameters, structural parameters, or both.

In some examples, a DOE set of metrology targets and corresponding actual device structures is produced on a single wafer. For example, the DOE set of metrology targets and actual device structures may be generated by varying any one or combination of etch settings, lithography focus, dose, aberration, and overlay settings as a function of location on the surface of a single wafer. In some examples, a DOE set of metrology targets and corresponding actual device structures is produced on several wafers. For example, the impact of variations in process parameters that affect the entire wafer such as deposition time, etch time, wafer level lithography focus, etc. can be explored with a set of multiple DOE wafers. In this manner, the impact on measured optical metrology signals and actual device parameters of interest from variations in process parameters is explored.

The training targets may be provided on a separate training wafer or on a production wafer. In some examples, the metrology targets are located in a scribeline of a production wafer. In some other examples, the metrology targets are located in the active die area.

In some examples, a special mask or set of masks including DOE variations is designed to produce training wafers. In some other examples, training targets can be located within production masks. In some other examples, DOE variations are entirely controlled by the process control settings without special masks or mask features.

Figure 6:
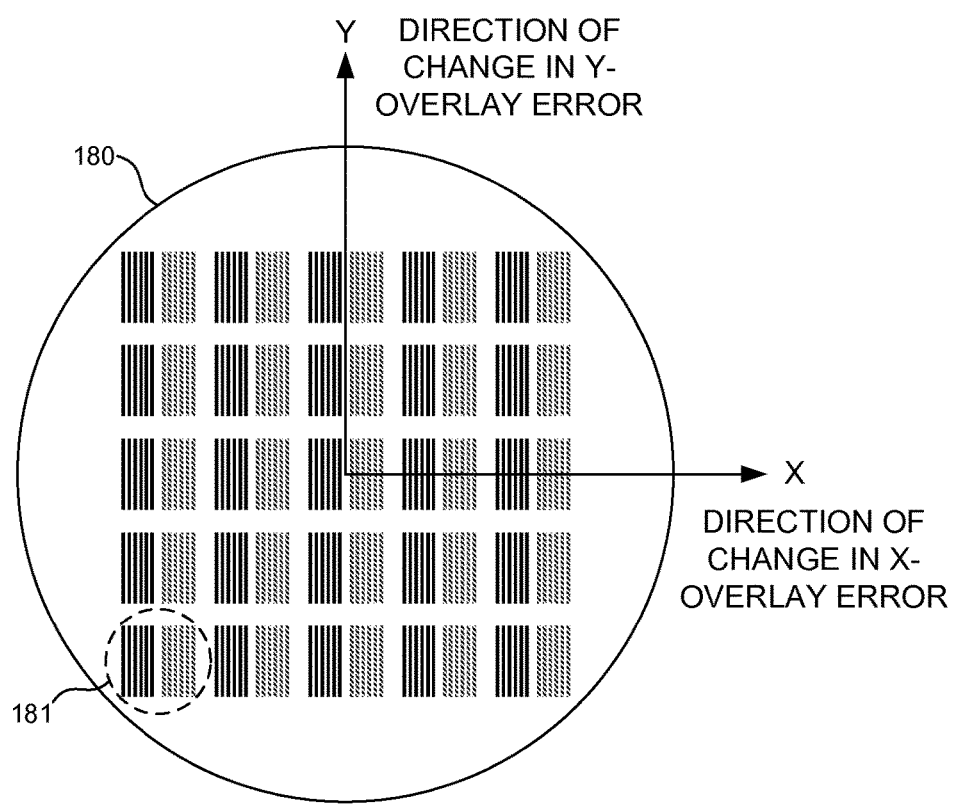
FIG. 6 illustrates a DOE wafer 180 having a grid of targets that exhibit known variations in overlay error in one embodiment.

In one example, the DOE pattern is a lithography overlay error pattern. Typically, a DOE wafer exhibiting an overlay error pattern includes a grid pattern of measurement sites. In one grid direction (e.g., the x-direction), the overlay is varied in the x-direction while the overlay in the y-direction is held constant. In the orthogonal grid direction (e.g., the y-direction), the overlay error in the y-direction is varied while the overlay error in the x-direction is held constant. In this manner, reference measurement data collected from the DOE wafer includes data associated with variations in lithography overlay settings in both the x and y directions. FIG. 6 depicts a DOE wafer 180 having a grid of targets (e.g., target 181) that exhibit sensitivity to variations in overlay. The x-direction overlay errors vary as a function of location on the DOE wafer 180 in the x-direction. The y-direction overlay errors vary as a function of location on the DOE wafer 180 in the y-direction. In some examples, the x and y overlay errors range from −20 nanometers to 20 nanometers. In some other examples, the x and y overlay errors range from −80 to 80 nanometers.

In general, the optical metrology targets are designed for printability and sensitivity to changes in process parameters, structural parameters of interest, or both. In some examples, the optical metrology targets are specialized targets that are not the same type as the corresponding actual device structure. In some embodiments, the metrology targets are based on conventional line/space targets. By way of non-limiting example, CD targets, SCOL targets, or AiM targets may be employed. In some other embodiments, the metrology targets are device-like structures. In some other examples, the optical metrology targets are device structures, or portions of device structures. Regardless of the type of metrology target employed, a set of training targets that exhibit sensitivity to the process variations, structural variations, or both, being explored must be provided to train the measurement model. Once the model is trained, it may be used to perform measurements of actual device structures having unknown values of one or more parameters of interest as described herein.

In some examples, optical measurements are performed, for example, with a spectroscopic ellipsometry (SE) tool that provides a broad range of wavelengths and also information about phase delay between two independent polarizations. In some examples, Mueller matrix SE may also be employed. In some other examples, optical measurements are performed by a wavelength-resolved or angle-resolved reflectometer.

Optionally, in block 103, a number of principal features are extracted from the optical measurement data based on a mathematical transformation. The transformation reduces the dimension of the optical measurement data and maps the original signals to a new reduced set of signals. Each measured signal is treated as an original signal that changes within the process range for different measurements in the set of optical measurement data. The transformation may be applied to all of measurement signals, or a subset of measurement signals. In some examples, the signals subject to analysis are chosen randomly. In some other examples, the signals subject to analysis are chosen due to their relatively high sensitivity to changes in process parameters. For example, signals that are not sensitive to changes in process parameters may be ignored.

By way of non-limiting example, the transformation may be achieved using any of a principal component analysis (PCA) model, a kernel PCA model, a non-linear PCA model, an independent component analysis (ICA) model or other dimensionality reduction methods using dictionaries, a discrete cosine transform (DCT) model, fast fourier transform (FFT) model, a wavelet model, etc.

In block 104, a measurement model is trained based on the optical measurement data and the reference measurement values of one or more parameters of interest of the actual device structure(s) measured by the reference metrology system. If optional block 103 is performed, the measurement model is trained based on the principal features extracted from the optical measurement data and the reference measurement values of one or more parameters of interest of the actual device structure(s) measured by the reference metrology system. In some embodiments, the measurement model is implemented as a neural network model. In one example, the number of nodes of the neural network is selected based on the features extracted from the training data. In other examples, the measurement model may be implemented as a linear model, a polynomial model, a response surface model, a support vector machines model, or other types of models. In some examples, the measurement model may be implemented as a combination of models. In some examples, the selected model is trained based on the principal features (reduced set of signals) and the reference values. The model is trained such that its output fits the reference measurement values for all the measured signals in the process variation space defined by the set of DOE metrology targets and corresponding actual device structures.

In this manner, the trained measurement model maps the optical metrology signals measured with optical metrology tool(s) to the actual device parameters of interest measured with the reference tool(s).

In a further aspect, a mapping is determined between the process variables within the DOE process variation space and the actual device parameters of interest measured with the reference tool(s). Since the model is trained for all measured signals in the process variation space defined by the DOE set, the trained measurement model can be augmented to also map the process conditions to the actual device parameters of interest measured with the reference tool(s).

In a further aspect, the measurement model can be further trained to map the optical metrology signals measured with the optical metrology tool(s) to parameters of interest of the measured metrology targets that are either measured by the reference tool(s) or are known apriori (e.g., based on a known relationship between the parameter(s) of interest and the known process parameter values).

Figure 7:
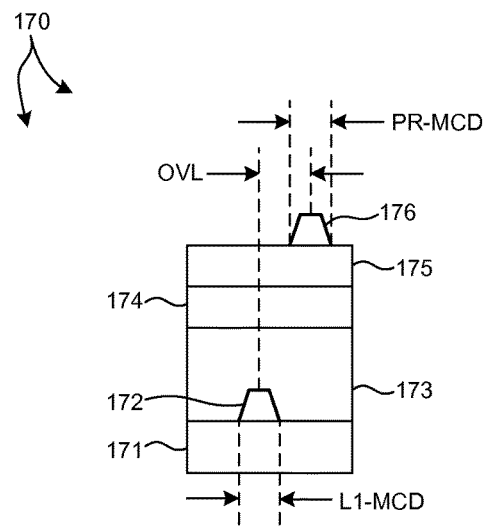
FIG. 7 depicts a cross-section of a metrology target 170 measured by an optical metrology system.

FIG. 7 depicts a cross-section of a metrology target 170 measured by an optical metrology system, e.g. scatterometry overlay. Metrology target 170 includes a material layer 171 that includes a structure 172 having a middle critical dimension, L1-MCD. Material layers 173 and 174 separate structure 172 from BARC layer 175. A photoresist structure 176 having a middle critical dimension, PR-MCD, is disposed on top of BARC layer 175. As depicted, metrology target 170 includes L1-MCD, PR-MCD, and an overlay offset, OVL, to be measured.

Figure 8:
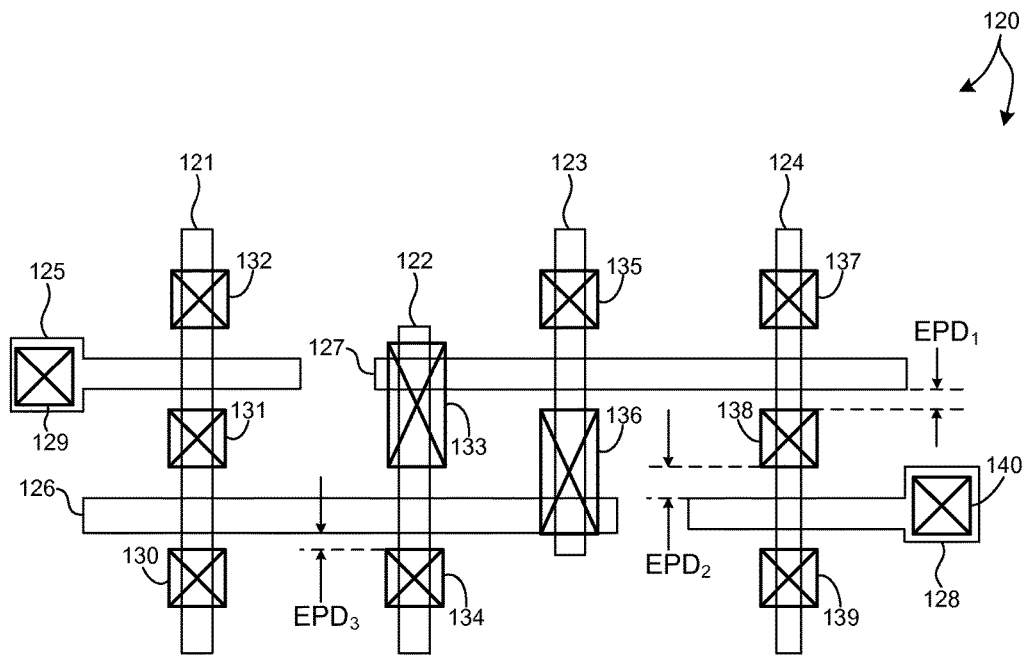
FIG. 8 depicts a top view of an actual device structure 120 that includes active fields 121-124, gates 125-128, and contacts 129-140.

FIG. 8 depicts a top view of the actual device structure 120 that includes active fields 121-124, gates 125-128, and contacts 129-140. FIG. 8 illustrates the edge placement distance, $EPD_1$, between gate 127 and contact 138. FIG. 8 also illustrates the edge placement distance, $EPD_2$, between gate 128 and contact 138 and the edge placement distance $EPD_3$, between gate 126 and contact 134. The edge placement distances must be carefully controlled to ensure high device yield. If the edge placement error associated with any of these edge placement distances is too large, the device will fail. As illustrated in FIG. 8, both overlay errors and CD errors contribute to EPE. For example, EPE results if the layers associated with the contact are misaligned with the layers associated with the gates. Similarly, EPE results if the CD associated with the contact structures deviates from nominal dimensions. For example, contacts 133 and 136 are too large. The result is overlap between each contact and corresponding gate structure and device failure.

In one example, process variations are introduced to generate a DOE set that includes variations of OVL, PR-MCD and L1-MCD. The DOE set is achieved on a single wafer by changing dose for each of the lithography steps that produce PR-MCD and L1-MCD and changing the overlay at the last lithography step. All process changes are predetermined and randomly distributed across the wafer. Multiple wafers with different randomly distributed DOE parameters can be used to increase the overall number of samples.

Figure 9:
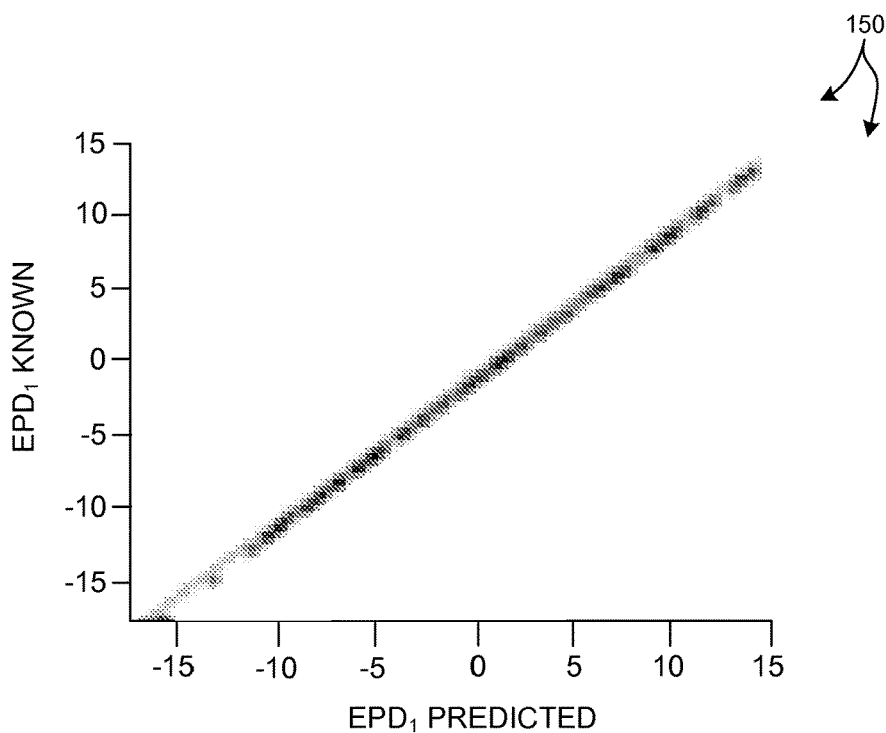
FIG. 9 illustrates a plot 150 of known values of edge placement distance ($EPD_1$) and the values predicted by the trained SRM measurement model for actual device structure 120 depicted in FIG. 8.
Figure 10:
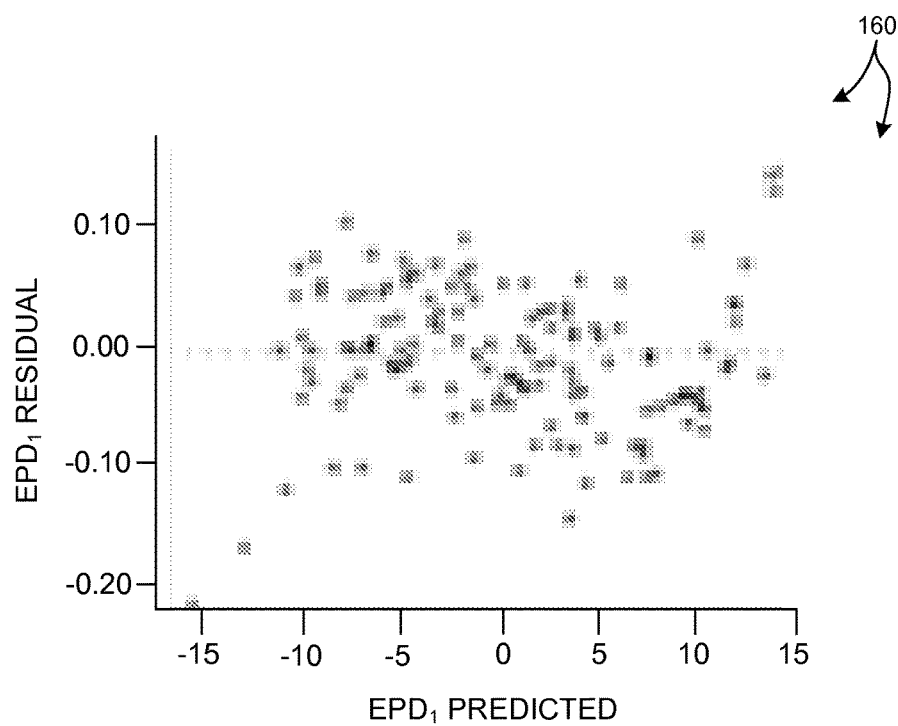
FIG. 10 illustrates a plot 160 of the residual values of $EPD_1$ for each data point.

In this example, optical scatterometry signals are collected from the DOE wafers at each metrology target (e.g., metrology target 170). In addition, the corresponding reference EPD measurements (e.g., CD-SEM or CD-SAXS) of each corresponding device structure (e.g., device structure 120) are collected. The optical measurement data and the reference measurements are used for creating a SRM measurement model. In one example, the SRM model is trained to predict the $EPD_1$ parameter value as depicted in FIG. 8. The results of the training of the SRM measurement model are illustrated in FIGS. 9 and 10. In this example, the measurement performance of the trained measurement model is determined by using the model to measure a set of metrology targets and corresponding device structure parameters that have not participated as part of the training data set, but correspond with device structures with known EPD values (e.g., measured by CD-SEM or CD-SAXS). The differences between the expected and measured EPD values are indicative of model performance. FIG. 9 illustrates a plot 150 of the known values of $EPD_1$ and the values predicted by the trained SRM measurement model. FIG. 10 illustrates a plot 160 of the residual values of $EPD_1$ (the difference between the actual and predicted values of $EPD_1$) for each data point. As illustrated in FIG. 10, the residual error associated with the measurement of $EPD_1$ is in the sub-nanometer range.

In a similar manner, the same scatterometry signals from the same metrology target can be used to create different SRM models for measuring other parameter values such as $EPD_2$, $EPD_3$, and overlay associated with actual device structure 120. For example, a SRM model may be employed to map overlay measured on special metrology targets (e.g., metrology target 170) to overlay associated with an actual device structure (e.g., actual device structure 120). In an analogous manner, the same scatterometry signals from the same metrology target can be used to create different SRM models for measuring parameter values associated with the metrology target itself, such as OVL, PR-MCD and L1-MCD using the corresponding reference values from the DOE.

Figure 4:
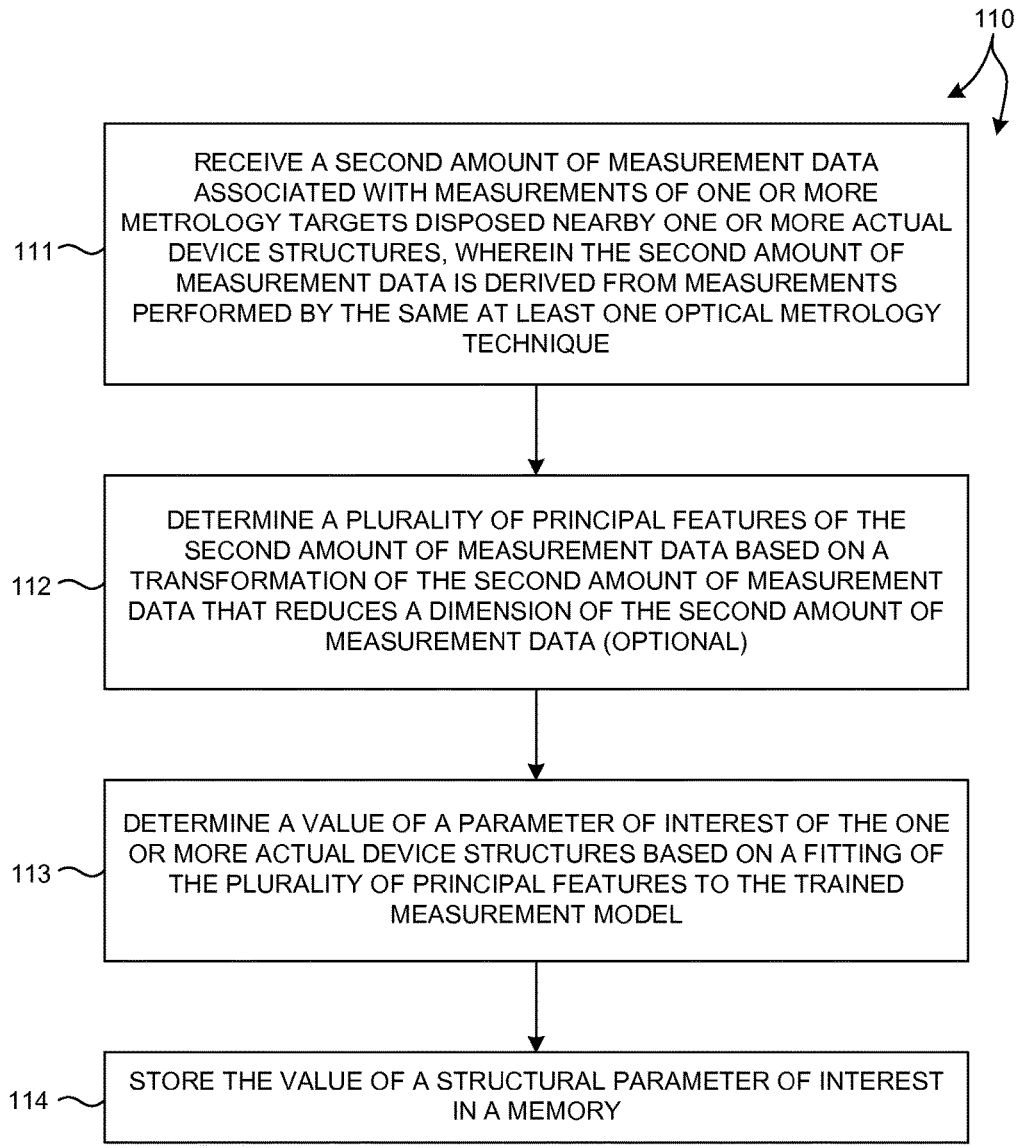
FIG. 4 illustrates a method 110 of measuring actual device structures based on measurements of a nearby metrology target based on a trained SRM measurement model.

In another aspect, the trained model is employed as the measurement model for other actual device structures having unknown parameter values. The measurement model is structured to receive optical measurement data generated by one or more optical metrology systems at one or more metrology targets, and directly determine one or more parameters of interest of corresponding actual device structures. FIG. 4 illustrates a method 110 suitable for implementation by a metrology system such as metrology system 300 illustrated in FIG. 5 of the present invention. In one aspect, it is recognized that data processing blocks of method 110 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 111, an amount of optical measurement data associated with measurements of one or more metrology targets disposed nearby one or more actual device structures is received by a computing system (e.g., computing system 330). The optical measurement data is derived from measurements performed by the same optical metrology technique, or combination of optical metrology techniques as described with reference to method 100. Similarly, the optical measurement data includes measurements of the same types of structures as described with reference to method 100, but with unknown device parameter values.

In optional block 112, principal features from at least a portion of the measured data are determined based on a mathematical transformation that reduces the dimension of the measured data. In some embodiments, the transformation is the same transformation employed to reduce the dimension of the corresponding training data described with reference to method 100. It is preferred to extract features from the optical measurement data using the same analysis employed to extract features from the training data in method 100. In this manner, the dimension reduction of the acquired data is performed by the same transformation used to reduce the dimension of the training data.

In block 113, the value of one or more parameter values of one or more actual device structures is determined based on a fitting of the optical measurement data to a trained measurement model (e.g., the trained measurement model described with reference to method 100). When optional block 112 is employed, the value of one or more parameter values of one or more actual device structures is determined based on a fitting of the principal features to the trained measurement model. In this manner, device parameter values are determined based on the trained measurement model and the reduced set of measurement signals.

In block 114, the determined device parameter values are stored in a memory. For example, the device parameter values may be stored on-board the measurement system 300, for example, in memory 332, or may be communicated (e.g., via output signal 340) to an external memory device.

As described hereinbefore, the measurement model is trained for all measured signals in the process variation space defined by the DOE set. Thus, a mapping may be determined between the process variables within the DOE process variation space and the actual device parameters of interest measured with the reference tool(s).

Figure 11:
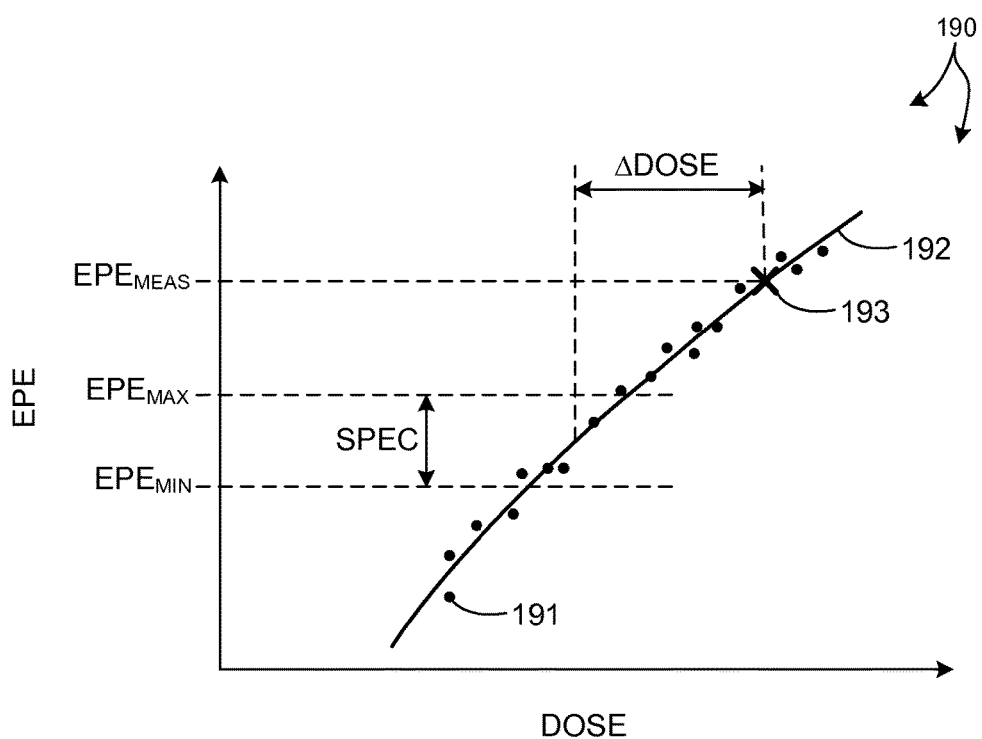
FIG. 11 depicts an diagram 190 illustrative of data points 191 that represent values of EPE measured by a reference measurement system for each dosage represented in a DOE training set.

FIG. 11 depicts an illustrative diagram 190 including exemplary data points 191 that represent values of EPE measured by the reference measurement system for each dosage represented in the DOE training set. A functional relationship between EPE and dosage is established, for example, by fitting a curve 192 to data points 191.

In a further aspect, a correction to one or more process parameters is determined based on a measured value of an actual device parameter and a mapping between the actual device parameter and the one or more process parameters. For example, point 193 illustrated in FIG. 11 represents a measured value of EPE determined by a trained measurement model as described with reference to method 110. It is desired to correct the process dosage such that a subsequent measured value of EPE will be within the specification range between $EPE_{max}$ and $EPE_{min}$. Based on the functional mapping between EPE and dosage, a dosage correction, $\Delta DOSE$, is determined that should result in a measured value of EPE that lands in the middle of the specification range.

The example illustrated in FIG. 11 is presented for illustrative purposes. In general, a multi-dimensional response surface can be created that relates the DOE process variables to the actual device parameters of interest. Corrections to one or more process parameters can be calculated to drive measured values of device parameters of interest within specification based on the multi-dimensional response surface.

In a further aspect, the methods and systems described herein are not limited only to the measurement of a single parameter of interest. In general, the aforementioned optical measurement techniques may be applied to the measurement of other process, structure, dispersion parameters, or any combination of these parameters. By way of non-limiting example, overlay, profile geometry parameters (e.g., critical dimension), process parameters (e.g., focus, and dose), dispersion parameters, pitch walk, edge placement errors, or any combination of parameters may be measured using the aforementioned techniques. A set of training targets with variations of each parameter of interest must be provided. The measurement model is then trained based on optical measurement data collected over metrology targets and reference measurements of device parameter values that include the range of variations of each parameter of interest as described herein. With a measurement model trained for each parameter of interest, a single metrology target measurement can provide input to the measurement models to determine values of each parameter of interest.

In another further aspect, the methods and systems for training the measurement model include an optimization algorithm to automate any or all of the elements required to arrive at a trained measurement model.

In some examples, an optimization algorithm is configured to maximize the performance of the measurement (defined by a cost function) by optimizing any or all of the following parameters: the type of feature extraction model (i.e., transformation), the parameters of the selected feature extraction model, the type of measurement model, the parameters of the selected measurement model. The optimization algorithm can include user defined heuristics and can be combination of nested optimizations (e.g., combinatorial and continuous optimization).

In a further aspect, optical measurement data from multiple, different targets is collected for model building, training, and measurement. The use of data associated with multiple targets having different structure, but formed by the same process conditions increases the information embedded in the model and reduces the correlation to process or other parameter variations. The additional information embedded in the model allows for a decoupling of information content associated with one parameter of interest from information associated with other parameters (e.g., film thicknesses, CD, etc.) that may affect the measured signals in a similar manner. In these examples, the use of training data that includes images of multiple, different targets at one or more measurement sites enables more accurate parameter estimation. In some examples, a mixture of isolated and dense line/space targets is employed to decouple overlay from underlayer effects. In some examples, multiple, different targets offset in orthogonal directions are employed in each die. This may be advantageous to minimize the effects of underlayers on measurement accuracy. In one example, SRAM device area can be used as one metrology target because it is sensitive to CD changes in combination with another metrology target sensitive to overlay.

In another further aspect, signals from multiple targets can be processed to reduce sensitivity to process variations and increase sensitivity to the parameters of interest. In some examples, signals from different targets are subtracted from one another. In some other examples, signals from different targets are fit to a model, and the residuals are used to build, train, and use the measurement model as described herein. In one example, signals from two different targets are subtracted to eliminate, or significantly reduce, the effect of process noise in each measurement result. In general, various mathematical operations can be applied between the signals from different targets to determine signals with reduced sensitivity to process variations and increased sensitivity to the parameters of interest.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the correlation to process or other parameters variations. Measurement data may be derived from measurements performed by any combination of multiple, different measurement techniques. In this manner, different measurement sites may be measured by multiple, different measurement techniques (e.g., optical SE, imaging overlay, etc.) to enhance the measurement information available for estimation of parameters of interest.

In general, any measurement technique, or combination of two or more measurement techniques may be contemplated within the scope of this patent document as the data processed by the feature extraction model and the measurement model for training and measurement is in vector form. Because the signal response metrology techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the signal response metrology techniques described herein include, but are not limited to spectroscopic ellipsometry, including Mueller matrix ellipsometry, spectroscopic reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WAXS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), x-ray tomography, and x-ray ellipsometry. In general, any metrology technique applicable to the characterization of semiconductor structures, including image based metrology techniques, may be contemplated, individually, or in any combination.

In another further aspect, signals measured by multiple metrologies can be processed to reduce sensitivity to process variations and increase sensitivity to the parameters of interest. In some examples, signals from targets measured by different metrologies are subtracted from one another. In some other examples, signals from targets measured by different metrologies are fit to a model, and the residuals are used to build, train, and use the measurement model as described herein. In one example, signals from a target measured by two different metrologies are subtracted to eliminate, or significantly reduce, the effect of process noise in each measurement result. In general, various mathematical operations can be applied between the signals measured by different metrologies to determine signals with reduced sensitivity to process variations and increased sensitivity to the parameters of interest.

In general, signals from multiple targets each measured by multiple metrology techniques increases the information content in the combined set of signals and reduces the correlation to process or other parameter variations.

In a further aspect, the methods and systems for training and measuring actual device structures as described hereinbefore are implemented in a differential mode. In such a scheme the metrology target measurements and any associated reference measurements are performed at two distinct steps in the processing flow. The differences in the measured signals at each distinct processing step are treated as training signals for training purposes and measurement signals for measurement purposes.

In one example, the same location points are used for metrology target measurements at a lithography step and a subsequent etch step. The difference signal between the lithography and etch steps allows for monitoring of process variability on a per point site basis even if the structure varies between points on the wafer (e.g., due to process steps or small positioning errors). Such differential metrology mode may be preferred for metrology of SRAM device area where variations of the measurement target are present between different fields on the wafer.

In some examples, variations of the measurement target arise from a deficiency in the periodicity of the measured structures, e.g., finite structure size or in situations where the otherwise periodic structure is insufficiently repeated within the measurement spot of the metrology system. In some examples, variations of the measurement target arise from a small spot size of the optical metrology system and measurement location placement errors of the metrology system.

In some examples, the differences between actual device parameter values before and after one or more etch steps may be used as an input to the closed loop control of the etch process.

In general, differential SRM metrology allows for global (wafer), field (field average), or local (per site) results that can be used, for example, to set the target bias between two process monitoring steps (i.e., etch and lithography), provide per field correction, or provide high order correction (e.g., OVL or EPE control).

Figure 5:
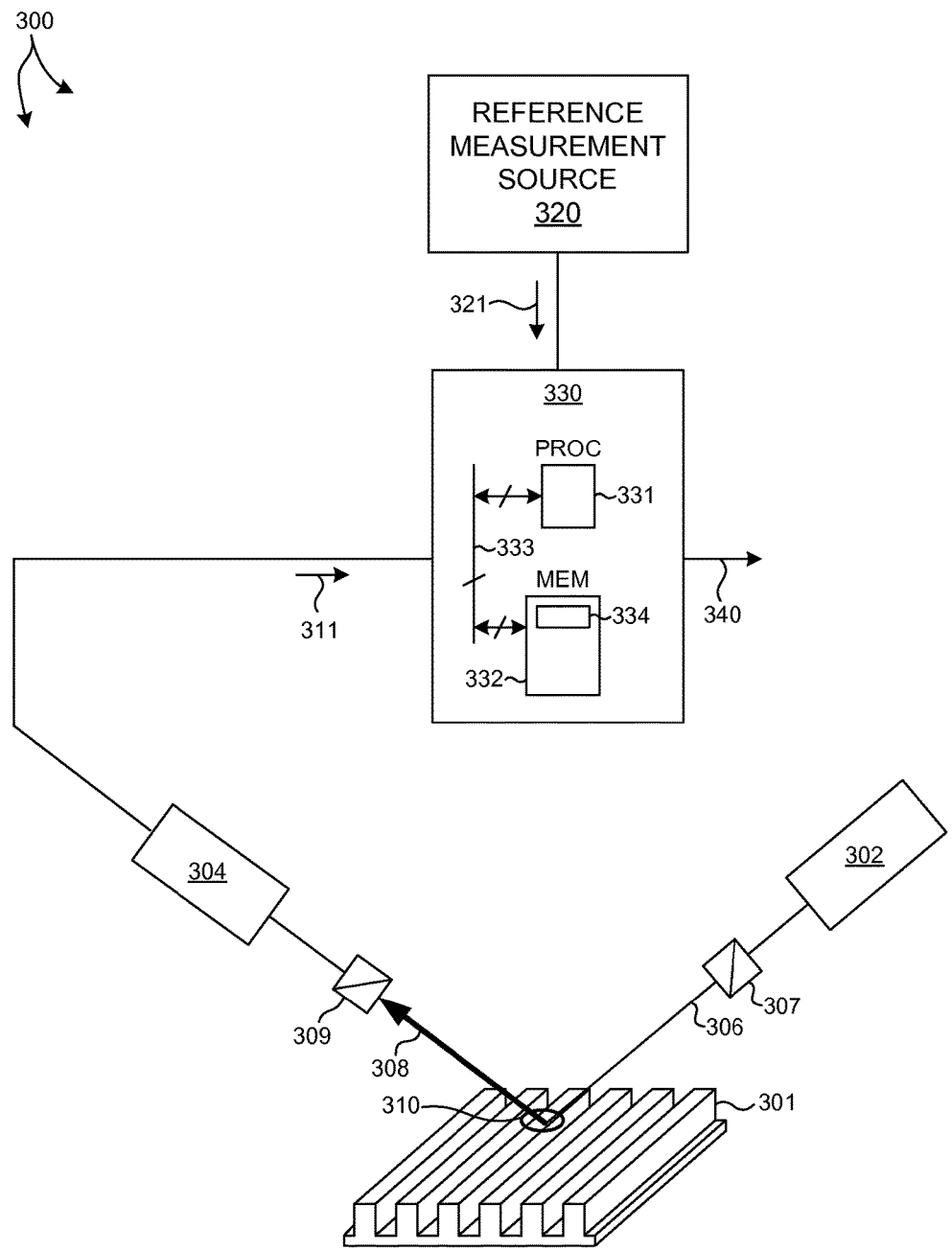
FIG. 5 depicts a metrology system 300 suitable for implementation of method 100 depicted in FIG. 3 and method 110 depicted in FIG. 4.

FIG. 5 illustrates a system 300 for measuring characteristics of a specimen in accordance with the exemplary methods presented herein. As shown in FIG. 5, the system 300 may be used to perform spectroscopic ellipsometry measurements of one or more structures of a specimen 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 100-2500 nm) to the structure disposed on the surface of the specimen 301. In turn, the spectrometer 304 is configured to receive illumination reflected from the surface of the specimen 301. It is further noted that the light emerging from the illuminator 302 is polarized using a polarization state generator 307 to produce a polarized illumination beam 306. The radiation reflected by the structure disposed on the specimen 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure.

As depicted in FIG. 5, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 300 may include one or more computing systems 330 employed to perform measurements of actual device structures based on measurement models developed in accordance with the methods described herein. The one or more computing systems 330 may be communicatively coupled to the spectrometer 304. In one aspect, the one or more computing systems 330 are configured to receive measurement data 311 associated with measurements of the structure of specimen 301.

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of the integrated metrology system 300 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 330 and other systems (e.g., memory on-board metrology system 300, external memory, reference measurement source 320, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. In another example, the computing system 330 may be configured to receive reference measurement data 321 from a reference measurement source (e.g., a storage medium) via a data link. For instance, reference measurement results obtained using a reference measurement system may be stored in a permanent or semi-permanent memory device. In this regard, the reference measurement results may be imported from on-board memory or from an external memory system. Moreover, the computer system 330 may send data to other systems via a transmission medium. For instance, an measurement model or an actual device parameter value 340 determined by computer system 330 may be communicated and stored in an external memory. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 334 implementing methods such as those described herein may be transmitted over a transmission medium such as a wire, cable, or wireless transmission link. For example, as illustrated in FIG. 5, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

In some examples, the model building, training, and measurement methods described herein are implemented as an element of a SpectraShape® optical critical-dimension metrology system available from KLA-Tencor Corporation, Milpitas, Calif., USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In yet another aspect, the measurement model results described herein can be used to provide active feedback to a process tool (e.g., lithography tool, etch tool, deposition tool, etc.). For example, values of EPE or overlay error determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to a lithography tool, etch tool, or deposition tool.

In general, the systems and methods described herein may be implemented as part of the process of preparing a measurement model for off-line or on-tool measurement.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 300 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
    receiving reference values of one or more parameters of interest of one or more actual device structures repeatedly fabricated over a range of values of one or more process variables, wherein the reference values are measured by a reference metrology system;
    providing a first amount of illumination light to one or more metrology targets disposed nearby the one or more actual device structures;
    detecting an amount of light from the one or more metrology targets in response to the first amount of illumination light provided to the one or more metrology targets, the detected amount of light comprising a first amount of optical measurement data;
    receiving the first amount of measurement data, wherein the first amount of measurement data is derived from measurements performed by at least one optical metrology system that is different from the reference metrology system; and
    training a measurement model based on the first amount of measurement data and the reference values of the one or more parameters of interest.

2. The method of claim 1, wherein the training of the measurement model involves:
    determining a mapping between each of the one or more process variables and the reference values of the one or more parameters of interest of the one or more actual device structures.

3. The method of claim 2, further comprising:
    receiving a second amount of measurement data associated with measurements of one or more metrology targets disposed nearby one or more actual device structures, wherein the second amount of measurement data is derived from measurements performed by the same at least one optical metrology technique;
    determining a measured value of a parameter of interest of the one or more actual device structures based on a fitting of a second amount of measurement data to the trained measurement model; and
    storing the value of the parameter of interest in a memory.

4. The method of claim 3, further comprising:
    determining a correction to a value of one or more of the process variables based on the measured value of the parameter of interest and the mapping between each of the one or more process variables and the reference values of the one or more parameters of interest of the one or more actual device structures.

5. The method of claim 1, wherein the training of the measurement model involves:
    determining a plurality of principal features of the first amount of measurement data based on a transformation of the first amount of measurement data that reduces a dimension of the first amount of measurement data.

6. The method of claim 5, wherein the transformation of the first amount of optical measurement data involves any of a principal component analysis (PCA), an independent component analysis (ICA), a kernel PCA, a non-linear PCA, a fast Fourier transform (FFT) analysis, a discrete cosine transform (DCT) analysis, and a wavelet analysis.

7. The method of claim 5, wherein the transformation of the first amount of optical measurement data involves determining a difference between signals from measurements of different targets, signals from measurements acquired by different metrology techniques, signals from measurements acquired at different process steps, or any combination thereof.

8. The method of claim 5, wherein the transformation of the first amount of optical measurement data involves determining residuals of a model fit to signals from measurements of different targets, signals from optical measurements acquired by different metrology techniques, signals from measurements acquired at different process steps, or any combination thereof.

9. The method of claim 1, wherein the measurement model is any of a linear model, a polynomial model, a neural network model, a support vector machines model, a decision tree model, and a random forest model.

10. The method of claim 1, wherein the first amount of optical measurement data includes a combination of measurements of a plurality of different metrology targets formed by the same values of the one or more process variables.

11. The method of claim 1, wherein the first amount of optical measurement data includes measurements acquired by a plurality of different metrology techniques.

12. The method of claim 1, wherein the metrology target is an actual device structure.

13. The method of claim 1, wherein the one or more parameters of interest includes any of edge placement distance, edge placement error, and overlay.

14. The method of claim 1, wherein the reference metrology system includes any one or combination of a scanning electron microscope and a small-angle x-ray scatterometer.

15. A system comprising:
    an optical metrology tool including at least one illumination source that provides a first amount of illumination light to one or more metrology targets disposed nearby one or more actual device structures and at least one detector that detects an amount of light from the one or more metrology targets in response to the first amount of illumination light provided to the one or more metrology targets, the detected amount of light comprising a first amount of optical measurement data; and
    a non-transitory, computer-readable medium storing instructions that, when executed by one or more processors, cause the one or more processors to:
        receive reference values of one or more parameters of interest of the one or more actual device structures repeatedly fabricated over a range of values of one or more process variables, wherein the reference values are measured by a reference metrology system that is different from the optical metrology tool;

receive the first amount of measurement data associated with the measurements of one or more metrology targets disposed nearby the one or more actual device structures by the optical metrology tool; and train a measurement model based on the first amount of measurement data and the reference values of the one or more parameters of interest.

16. The system of claim 15, the non-transitory, computer-readable medium further storing instructions that, when executed by the one or more processors, cause the one or more processors to:

receive a second amount of measurement data associated with measurements of one or more metrology targets disposed nearby one or more actual device structures, wherein the second amount of measurement data is derived from measurements performed by the same at least one optical metrology technique;

determine a measured value of a parameter of interest of the one or more actual device structures based on a fitting of a second amount of measurement data to the trained measurement model; and store the value of the parameter of interest in a memory.

17. The system of claim 15, wherein the first amount of optical measurement data includes a combination of measurements of a plurality of different metrology targets formed by the values of the one or more process variables.

18. The system of claim 15, wherein the first amount of optical measurement data includes a combination of measurements acquired by a plurality of different metrology techniques.

19. The system of claim 15, wherein the metrology target is an actual device structure.

20. The system of claim 15, wherein the reference metrology system includes any one or combination of a scanning electron microscope and a small-angle x-ray scatterometer.

21. A method comprising:

providing an amount of illumination light to one or more metrology targets disposed nearby one or more actual device structures;

detecting an amount of light from the one or more metrology targets in response to the first amount of illumination light provided to the one or more metrology targets, the detected amount of light comprising an amount of optical measurement data;

receiving the amount of optical measurement data associated with measurements of the one or more metrology targets disposed nearby the one or more actual device structures, wherein the amount of optical measurement data is derived from measurements performed by at least one optical metrology technique;

determining a value of a parameter of interest of the one or more actual device structures based on a fitting of the amount of measurement data to a trained measurement model, wherein the trained measurement model is trained based on measurement data collected from an optical metrology tool and measurement data collected from a reference metrology tool, wherein the optical metrology tool is different from the reference metrology tool; and storing the value of the parameter of interest in a memory.

22. The method of claim 21, further comprising:

determining a correction to a value of one or more process variables based on the measured value of the parameter of interest and a mapping between each of the one or more process variables and reference measurement values of the parameter of interest of the one or more actual device structures.

* * * * *